(12) United States Patent
Lai et al.

(10) Patent No.: US 9,368,375 B2
(45) Date of Patent: Jun. 14, 2016

(54) APPARATUS AND METHOD FOR SELF-ALIGNING CHIP PLACEMENT AND LEVELING

(71) Applicant: TAIWAN SEMICONDUCTOR MANUFACTURING COMPANY, LTD., Hsinchu (TW)

(72) Inventors: Jui Hsieh Lai, Taoyuan (TW); Ying-Hao Kuo, Hsinchu (TW); Kuo-Chung Yee, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 160 days.

(21) Appl. No.: 14/051,796

(22) Filed: Oct. 11, 2013

(65) Prior Publication Data

US 2015/0104909 A1 Apr. 16, 2015

(51) Int. Cl.
*H01L 23/02* (2006.01)
*H01L 21/56* (2006.01)
*H01L 23/00* (2006.01)
*H01L 21/00* (2006.01)

(52) U.S. Cl.
CPC .............. *H01L 21/565* (2013.01); *H01L 24/19* (2013.01); *H01L 21/561* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 5,616,952 A | 4/1997 | Nakano et al. | |
| 6,134,111 A | 10/2000 | Kinsman et al. | |
| 8,035,213 B2 | 10/2011 | Lee et al. | |
| 8,803,326 B2 | 8/2014 | Liu et al. | |
| 8,901,739 B2 | 12/2014 | Fuergut et al. | |
| 2007/0200225 A1* | 8/2007 | Ibrahim | H01L 23/4334 257/712 |
| 2012/0032314 A1* | 2/2012 | Chen | H01L 21/563 257/666 |
| 2012/0319245 A1* | 12/2012 | Low | H01L 21/565 257/618 |
| 2015/0318239 A1 | 11/2015 | Lai et al. | |

* cited by examiner

*Primary Examiner* — Calvin Choi
(74) *Attorney, Agent, or Firm* — Slater Matsil, LLP

(57) ABSTRACT

An approach is provided for aligning and leveling a chip package portion. The approach involves filling, at least partially, a reservoir formed between a first sidewall portion having a first slanted surface and a second sidewall portion having a second slanted surface with a fluid. The approach also involves placing a chip package portion into the reservoir. The approach further involves draining the fluid from the reservoir to cause the chip package portion to align with respect to a center of the reservoir. The chip package portion aligns with respect to the center of the reservoir and levels based on a relationship between the chip package portion, an angle of the first slanted surface, an angle of the second slanted surface, and the fluid. The chip package portion is secured in the aligned and leveled state by a molding compound.

25 Claims, 12 Drawing Sheets

APPARATUS AND METHOD FOR SELF-ALIGNING CHIP PLACEMENT AND LEVELING

RELATED APPLICATIONS

This application is related to co-pending U.S. patent application Ser. No. 14/060,764, filed Oct. 23, 2013, entitled "Apparatus and Method for a Molding Process," by Jui Hsieh Lai, et al., the entirety of which is hereby incorporated by reference.

BACKGROUND

Device manufacturers are continually challenged to deliver microchip packages that have low manufacturing costs and offer high quality while meeting ever growing supply demands.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Device manufacturers are continually challenged to deliver microchip packages that have low manufacturing costs and offer high quality while meeting ever growing supply demands. Conventional chip packages are manufactured using a pick up and place process (also referred to as a pick and place process or a pick and place system for systems implementing the process) that requires high accuracy equipment systems to place chips or chip portions at correct positions for particular manufacturing processes. The cost of such high accuracy pick and place systems increases the costs of manufacturing various microchip and reduces manufacturing throughput over a period of time.

Chip package manufacturing processes often use a polymer compound or molding compound during the manufacturing process. Various applications of the molding compound and/or curing processes associated with setting the molding compound often cause one or more chip package portions to shift from a precisely placed position. Positional shifting during the manufacturing process results in reduced manufacturing process speeds, reduced quality, increased waste, and ultimately increased manufacturing costs.

Figure 1:
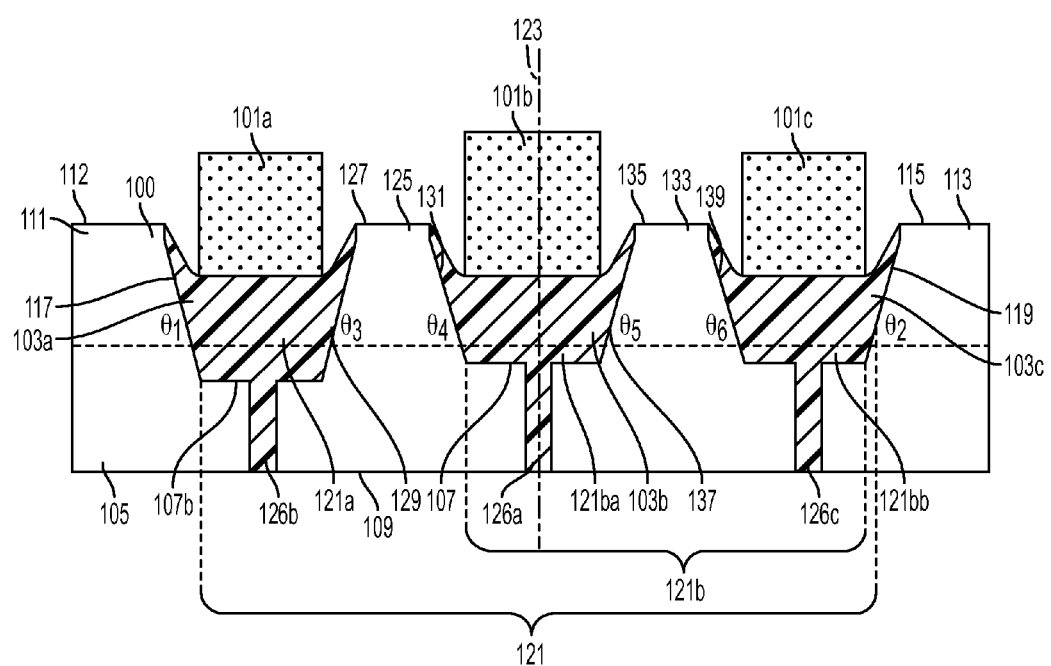
FIG. 1 is a diagram of a cross sectional view of a chip placement tray, in accordance with one or more embodiments.

FIG. 1 is a cross sectional side-view of a chip placement tray 100 according to one or more embodiments. The cross sectional view is taken with respect to cross section A-A' in either of FIG. 10 or FIG. 11.

The chip placement tray 100 is configured to enable one or more chip package portions 101a-101c (hereinafter collectively referred to as chip package portion 101 where appropriate) to be self-aligned and leveled. The chip placement tray 100 enables the one or more chip package portions 101 to be self-aligned and leveled by harnessing the relationship between particular geometries of the chip placement tray 100, fluid 103a-103c (hereinafter referred to as "fluid 103" where appropriate) accommodated by the chip placement tray 100, and geometries of the one or more chip package portions 101.

The chip placement tray 100 provides an easy way to achieve high accuracy placement and refined positioning for chip package portions 101. In at least some embodiments, the placement and position using chip placement tray 100 is obtained without expensive equipment or systems. The chip placement tray 100 is also configured to prevent excessive shifting of the chip package portions 101 during a curing process associated with manufacturing a microchip or chip package having chip package portions 101.

In some embodiments, the chip placement tray 100 is configured to be oriented in an upright position for one or more manufacturing processes. In other embodiments, the chip placement tray 100 is configured to be flipped from the upright position such that the chip placement tray 100 is oriented in an inverted position for one or more manufacturing processes.

According to various embodiments, the chip placement tray 100 comprises one or more of silicon, glass, polymer, metal, or other suitable material. In some embodiments, the chip placement tray 100 is molded. In other embodiments, the chip placement tray 100 is assembled using modular components or layers. In further embodiments, the chip placement tray 100 is formed by an etching process. In some embodiments, the chip placement tray 100 is recycled for future manufacturing processes. In other embodiments, the chip placement tray 100 is configured to at least partially be incorporated into a microchip or chip package that includes chip package portions 101.

According to various embodiments, the chip placement tray 100 includes a base portion 105 having an upper surface 107 and a lower surface 109. Lower surface 109 is opposite the upper surface 107. The chip placement tray 100 also includes a first sidewall portion 111 having a first upper portion 112 distal the upper surface 107 of the base portion 105. The chip placement tray 100 further includes a second sidewall portion 113 having a second upper portion 115 distal the upper surface 107 of the base portion 105.

In some embodiments, the upper surface 107 is parallel to the lower surface 109. In some embodiments, the upper surface 107 is parallel to the lower surface 109 and extends uniformly across a width of the base portion 105 such that the base portion 105 has a uniform thickness across the width between the lower surface 109 and the upper surface 107.

In some embodiments, the upper surface 107 is parallel to the lower surface 109, the upper surface 107 is segmented across the width of the base portion 105, and the segmented portions of the upper surface 107 yield a uniform thickness between the segmented portions of the upper surface 107 and the lower surface 109 across the width of the base portion 105.

In some embodiments, the upper surface 107 is parallel to the lower surface 109, the upper surface 107 is segmented across the width of the base portion 105, and the segmented portions of the upper surface 107 yield differing thicknesses between the segmented portions of the upper surface 107 and the lower surface 109 across the width of the base portion 105. For example, if the base portion 105 includes an upper surface 107 having a segmented portion of the upper surface 107b, a thickness between the upper surface 107b and the lower surface 109 differs from a thickness between other segmented portions of the upper surface 107 and the lower surface 109.

In some embodiments, the first sidewall portion 111 and the second sidewall portion 113 are a part of the base portion 105. In one or more embodiments, the first sidewall portion 111 and the second sidewall portion 113 comprise a layer different from the base portion 105. In various embodiments, the first sidewall portion 111 and the second sidewall portion 113 comprise a same material as the base portion 105. In one or more embodiments, the first sidewall portion 111 and the second sidewall portion 113 comprise a different material from the base portion 105 such as, for example, a resist material, a polymer, or other suitable material.

In some embodiments, the upper portion 112 of the first sidewall portion 111 and the upper portion 115 of the second sidewall portion 113 are configured to have relatively flat surfaces. In one or more embodiments, the upper portion 112 of the first sidewall portion 111 and the upper portion 115 of the second sidewall portion 113 are configured to have arched or rounded surfaces. In some embodiments, the upper portion 112 of the first sidewall portion 111 and the upper portion 115 of the second sidewall portion 113 are configured to be peaked or pointed geometries in the cross sectional side-view.

Accordingly, in some embodiments, a first slanted surface 117 faces in a direction toward the second sidewall portion 113 and extends from the first upper portion 112 of the first sidewall portion 111 toward the upper surface 107 of the base portion 105 at a first angle $\theta 1$. A second slanted surface 119 faces in a direction toward the first sidewall portion 111 and extends from the second upper portion 115 of the second sidewall portion 113 toward the upper surface 107 of the base portion 105 at a second angle $\theta 2$.

Though illustrated as having three reservoirs or sub-reservoirs 121a-121bb for accommodating one or more chip package portions 101 and fluid 103, the chip placement tray 100, in various embodiments, is configured to include a greater or lesser number of reservoirs based on a number of sidewall portions that are included in the chip placement tray 100. As such, any discussion referring to a first, second, third, fourth, etc. enumerated feature is provided for ease of understanding and should not limit the particular arrangement of features discussed in any way. For example, when generally describing a reservoir 121, reservoir 121 refers to a single reservoir in which a chip package portion 101 is placed. The reservoir 121, is formed between two sidewall portions, and is capable of having any width or depth. In some embodiments, reservoir 121 is separated into one or more sub-reservoirs 121a, 121b, 121ba and 121bb. In some embodiments, though discussed as a reservoir 121 that is divided into a series of sub-reservoirs, it should be understood that the discussed sub-reservoirs 121a-121bb, in some embodiments, are individual reservoirs configured to accommodate a chip package portion 101 and the fluid 103.

Reservoir 121 is formed between the first slanted surface 117 and the second slanted surface 119. The reservoir 121 is configured to accommodate a chip package portion 101 and cause the chip package portion 101 to align with respect to a center 123 of the reservoir 121 based on a relationship between the chip package portion 101, the first angle $\theta 1$, the second angle $\theta 2$, and the fluid 103 accommodated by the reservoir 121. In some embodiments, such a relationship also relies on the surface tension of the fluid 103 and the buoyancy of the chip package portion 101.

In embodiments, the chip placement tray 100 also includes a drain region 126 (corresponding to any of illustrated drain regions 126a, 126b and 126c, for example) between the first slanted surface 117 and the second slanted surface 119 configured to enable the fluid 103 to egress from the reservoir 121. Draining the fluid 103 from the reservoir 121 causes the chip package portion 101 to be lowered into the reservoir 121 as the surface of the fluid 103 is lowered toward the upper surface 107 during a draining process. As the fluid 103 egresses from the reservoir 121, the chip package portion 101 contacts the first slanted surface 117 and the second slanted surface 119, thereby directing the chip package portion 101 toward the center 123 of the reservoir 121.

In other embodiments, the chip placement tray 100 includes a third sidewall portion 125 having a third upper portion 127 distal the upper surface 107 of the base portion 105. In some embodiments, the third sidewall portion 125 comprises a same or a different material as the first sidewall portion 111, the second sidewall portion 113 and/or the base portion 105. In some embodiments, the third upper portion 127 comprises a same or a different geometry as one or more of the first upper portion 112 and the second upper portion 115.

In some embodiments, the third sidewall portion 125 is positioned between the first sidewall portion 111 and the second sidewall portion 113. A third slanted surface 129 facing in a direction toward the first side wall portion 111 extends from the third upper portion 127 of the third sidewall portion 125 toward the upper surface 107 of the base portion 105 at a third angle $\theta 3$. A fourth slanted surface 131 facing in a direction toward the second sidewall portion 113 extends from the third upper portion 127 of the third sidewall portion 125 toward the upper surface 107 of the base portion 105 at a fourth angle $\theta 4$.

In one or more embodiments, the third sidewall portion 125 divides the reservoir 121 into a first sub-reservoir 121a and a second-sub reservoir 121b. The first sub-reservoir 121a is formed between the first slanted surface 117 and the third slanted surface 129 and the second sub-reservoir 121b is formed between the second slanted surface 119 and the fourth slanted surface 131. The first sub-reservoir 121a and the second sub-reservoir 121b are configured to accommodate the first chip package portion 101a and the second chip package portion 101b, for example.

The first sub-reservoir 121a and the second sub-reservoir 121b, in some embodiments, are configured to accommodate chip package portions 101 of equal sizes. In other embodiments, the first sub-reservoir 121a and the second sub-reservoir 121b are configured to accommodate chip package portions 101 of different sizes.

Regardless of size, the first sub-reservoir 121a is configured to cause the first chip package portion 101a to align with respect to a center of the first sub-reservoir 121a based on a relationship between the first chip package portion 101a, the first angle θ1, the third angle θ3, and the fluid 103a accommodated by the first sub-reservoir 121a. The second sub-reservoir 121b is configured to cause the second chip package portion 101b to align with respect to a center of the second sub-reservoir 121b based on a relationship between the second chip package portion 101b, the second angle θ2, the fourth angle θ4, and the fluid 103b accommodated by the second-sub reservoir 121b.

According to various embodiments, the chip placement tray 100 includes a fourth sidewall portion 133 having a fourth upper portion 135 distal the upper surface 107 of the base portion 105. In some embodiments, the fourth sidewall portion 133 comprises a same or a different material as the first sidewall portion 111, the second sidewall portion 113, the third sidewall portion 125 and/or the base portion 105. In some embodiments, the fourth upper portion 135 comprises a same or a different geometry as one or more of the first upper portion 112, the second upper portion 115 and/or the third upper portion 127.

The fourth sidewall portion 133 is positioned between the third sidewall portion 125 and the second sidewall portion 113. A fifth slanted surface 137 faces in a direction toward the first side wall portion 111 and extends from the fourth upper portion 135 of the fourth sidewall portion 133 toward the upper surface 107 of the base portion 105 at a fifth angle θ5. A sixth slanted surface 139 facing in a direction toward the second sidewall portion 113 and extends from the fourth upper portion 135 of the fourth sidewall portion 133 toward the upper surface 107 of the base portion 105 at a sixth angle θ6.

The fourth sidewall portion 133 divides the second sub-reservoir 121b into two further sub-reservoirs, third sub-reservoir 121ba and fourth sub-reservoir 121bb. As such, third sub-reservoir 121ba is formed between the fourth slanted surface 131 and the fifth slanted surface 137 and fourth sub-reservoir 121bb is formed between the sixth slanted surface 139 and the second slanted surface 119.

The first sub-reservoir 121a, third sub-reservoir 121ba and the fourth sub-reservoir 121bb are configured to accommodate the first chip package portion 101a, the second chip package portion 101b and the third chip package portion 101c, respectively. The first sub-reservoir 121a is configured to cause the first chip package portion 101a to align with respect to a center of the first sub-reservoir 121a based on a relationship between the first chip package portion 101a, the first angle θ1, the third angle θ3, and fluid 103a accommodated by the first sub-reservoir 103a. The third sub-reservoir 121ba is configured to cause the second chip package portion 101b to align with respect to a center of the third sub-reservoir 121ba based on a relationship between the second chip package portion 101b, the fourth angle θ4, the fifth angle θ5 and fluid 103b accommodated by the third-sub reservoir 121ba. The fourth sub-reservoir 121bb is configured to cause the third chip package portion 101c to align with respect to a center of the fourth sub-reservoir 121bb based on a relationship between the third chip package portion 101c, the second angle θ2, the sixth angle θ6 and fluid 103c accommodated by the fourth sub-reservoir 121bb.

In some embodiments, the first angle θ1, the second angle θ2, the third angle θ3, fourth angle θ4, the fifth angle θ5 and the sixth angle θ6 are equal to one another. In other embodiments, the first angle θ1, the second angle θ2, the third angle θ3, fourth angle θ4, the fifth angle θ5 and the sixth angle θ6 are different from one another. In various embodiments, some of the first angle θ1, the second angle θ2, the third angle θ3, fourth angle θ4, the fifth angle θ5 and the sixth angle θ6 equal one another, while others differ. For example, some of the angles associated with a same reservoir equal one another, while other angles associated with another reservoir differ from one another. In another embodiment, some angles associated with a same reservoir differ to drive a chip portion 101 to be aligned off-center with respect to a center of the reservoir having differing angles, for example.

According to various embodiments, the base portion 105 has a thickness between the upper surface 107 and the lower surface 109. The thickness in some embodiments is the same with respect to upper surface 107 associated with the bottom of sub-reservoirs 121a, 121ba and 121bb (collectively referred to herein as reservoir 121 where appropriate). In other embodiments, the thickness is variable with respect to the upper surface 107 associated with the bottom of the various reservoirs 121. In other words, in some embodiments the depth of the individual sub-reservoirs making up reservoir 121 is the same. In other embodiments, the depth of at least one of the various individual sub-reservoirs making up reservoir 121 is different.

According to various embodiments, the fluid 103 accommodated by the first sub-reservoir 121a, the third sub-reservoir 121ba and the fourth sub-reservoir 121bb comprises the same fluid. In other embodiments, the fluid 103 varies depending on application and the reservoir 121 to which the fluid 103 is introduced. According to various embodiments, the fluid 103 comprises any liquid, polymer, or gel, for example, capable of allowing a chip portion 101 to float on or near a surface of the fluid 103.

In one or more embodiments, the chip placement tray 100 comprises the drain region 126a. In some embodiments, the drain region 126 enables the fluid 103 to egress from one or more reservoirs 121 on demand. In some embodiments, to facilitate drainage from neighboring reservoirs 121, thru-holes are provided to allow fluid 103 to drain from reservoirs 121 lacking a drain region 126.

In other embodiments, the chip placement tray 100 includes the first drain region 126a, a second drain region 126b and a third drain region 126c. The first drain region 126a corresponds to the first sub-reservoir 121a and is configured to allow the fluid 103a accommodated by at least the first sub-reservoir 121a to egress, a second drain region 126b corresponds to the third sub-reservoir 121ba and is configured to allow the fluid 103b accommodated by at least the third sub-reservoir 121ba to egress on demand, and a third drain region 126c corresponds to the third sub-reservoir 121bb and is configured to allow the fluid 103c accommodated by at least the third sub-reservoir 121bb to egress on demand.

In some embodiments, the fluid 103 is the same fluid within the reservoirs 121 so the drain regions 126a, 126b and 126c (collectively referred to herein as drain region 126, where appropriate) are optionally configured to drain the fluid 103 to a same location because mixing of the fluid 103 is allowable. In other embodiments, the drain regions 126a, 126b and 126c are configured to prevent mixture of the fluids 103a, 103b and/or 103c.

According to various embodiments, the chip package portions 101 are placed into any of the reservoirs 121 either one of before the fluid 103 is input into the reservoirs 121 or after the fluid 103 is input into the reservoirs 121. In some embodiments, when placed, the chip package portions 101 are dropped in to the reservoirs 121. In some embodiments, the fluid at least partially fills the reservoirs 121. Once the fluid 103 is input into the reservoirs 121 to fill the reservoirs to an appropriate depth, the chip package portions 101 float near a surface of the fluid 103 based on the surface tension of the fluid 103 and the buoyancy of the chip package portions 101.

Figure 2:
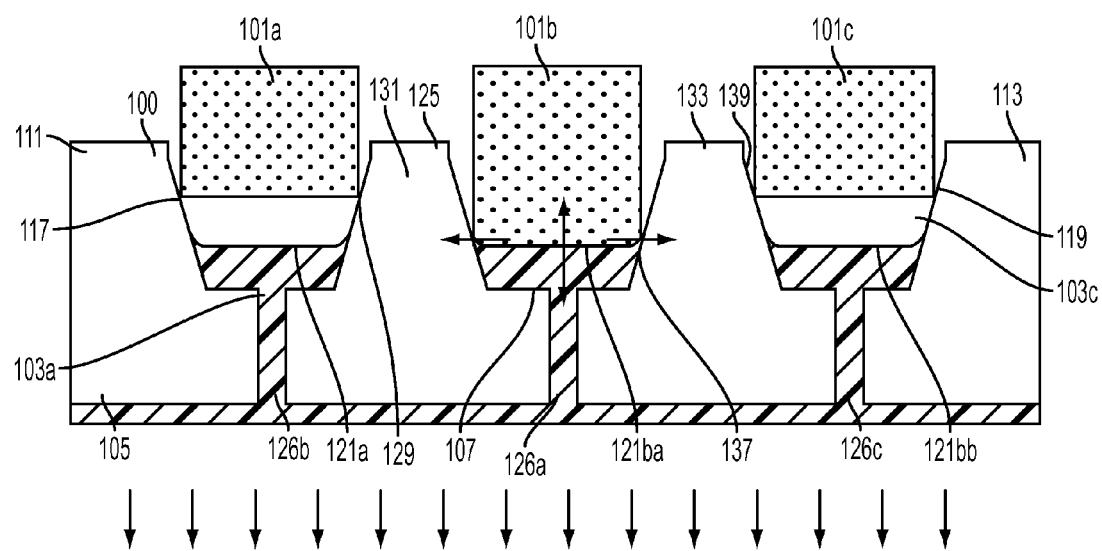
FIG. 2 is a diagram of a cross sectional view of a chip placement tray, in accordance with one or more embodiments.

FIG. 2 is a cross sectional view of a diagram illustrating the effect draining fluid 103 has on the position of the chip package portions 101 with respect to the chip placement tray 100, according to one or more embodiments. The cross sectional view is taken with respect to cross section A-A' in either of FIG. 10 or FIG. 11.

In this example, the fluid 103 is drained from the reservoirs 121 by way of drain regions 126. As the fluid 103 egresses from the reservoirs 121, the chip package portions 101 continue floating near the surface of the fluid 103 until one or more features or surfaces of the chip package portions 101 contact the slanted surfaces within the reservoirs 121. For example, the first chip package portion 101a is lowered into the first sub-reservoir 121a toward the upper surface 107 of the base portion 105 until the first chip package portion 101a contacts slanted surfaces 117 and 129. The first chip package portion 101a is lowered along with the surface of the fluid 103a and is maintained in a level state and the fluid 103a egresses from the first sub-reservoir 121a. The reservoirs 121 include slanted surfaces that reduce the surface area of the fluid 103 as the depth of the reservoirs 121 increase. Accordingly, as the fluid 103a egresses from the first sub-reservoir 121a, the first chip package portion 101a is driven toward a center of the first sub-reservoir 121a.

When driven toward the center of the first sub-reservoir 121a, the first chip package portion 101a self-aligns with the center of the first sub-reservoir 121a and levels as caused by a relationship between the respective slopes of, or angles associated with, the slanted surfaces 117 and 129, the fluid 103a and the first chip package portion 101a. The first chip package portion 101a is ultimately settled in an aligned and leveled state within the first sub-reservoir 121a after the first chip package portion 101a is no longer in contact with the surface of the fluid 103a, the fluid 103a having been at least partially drained out of the first sub-reservoir 121a. In other embodiments, the first chip package portion 101a is settled in the aligned and leveled state when the fluid 103 no longer causes the first chip package portion 101a to float near the surface of the fluid 103, but the fluid 103 is still in contact with the first chip package portion 101a.

Second and third chip package portion 101b and 101c are similarly caused to be in respective aligned and leveled states within third sub-reservoir 121ba and fourth sub-reservoir 121bb, respectively.

Figure 3:
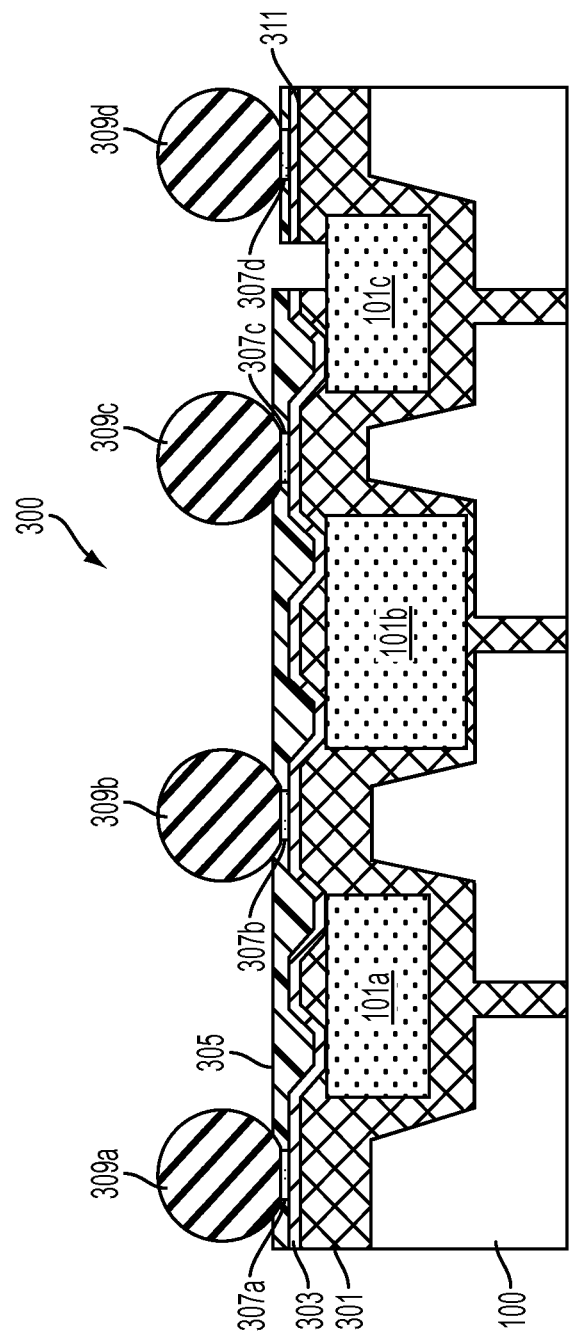
FIG. 3 is a diagram of a chip package, in accordance with one or more embodiments.

FIG. 3 is a cross sectional view of a chip package 300, according to one or more embodiments. The cross sectional view is taken with respect to cross section A-A' in either of FIG. 10 or FIG. 11. Chip package 300 has the chip placement tray 100 in an upright position.

To form the chip package 300, a molding compound 301 is provided to fill the reservoirs 121 of the chip placement tray 100 after fluid 103 is drained from the reservoirs 121. In some embodiments, the molding compound 301 is provided after the fluid 103 is entirely drained from the reservoirs 121. In other embodiments, the molding compound 301 is provided after the chip package portion 101 are in the respective aligned and leveled states established when the fluid 103 is at least partially drained from the reservoirs 121.

The molding compound 301 is provided to secure the chip package portions 101 in the aligned and leveled states. Because the chip package portions 101 are aligned and leveled based on the relationship between the chip package portions 101 and the slanted surfaces of the reservoirs 121, the chip package portions 101 remain in the aligned and leveled state while the molding compound 301 is provided. The molding compound 301, in some embodiments, comprises a polymer that is subjected to a curing process thereby securing the chip package portions 101 in the aligned and leveled state.

In some embodiments, an amount of molding compound 301 provided is limited to an amount that sufficiently secures the chip package portions 101 in the aligned and leveled state. In other embodiments, the amount of molding compound 301 provided at least partially covers an upper surface of the chip package portions 101. In various embodiments, the amount of molding compound 301 provided completely covers the chip package portions 101.

According to various embodiments, one or more dielectric layers 303, redistribution layers 305, under bump layers 307a-307d (hereinafter collectively referred to as under bump layer 307 where appropriate), under bumps 309a-309d (hereinafter collectively referred to as under bump 309 where appropriate), or any combination thereof, are formed on one or more of the chip package portions 101 and the molding compound 301 at a time when the chip package portions 101 are secured in the aligned and leveled state. In some embodiments, one or more of the dielectric layers 303, redistribution layers 305, under bump layer 307, and under bumps 309 are formed on one or more of the chip package portions 101 and the molding compound 301 after the molding compound 301 is cured.

According to various embodiments, the molding compound 301 is subjected to a planarization process to form a planarized region 311 on the molding compound 301 prior to forming the any of the dielectric layers 303, redistribution layers 305, under bump layer 307, and under bumps 309. The dielectric layers 303, redistribution layers 305, under bump layer 307, and under bumps 309, accordingly, are formed on the planarized region 311. In other embodiments, dielectric layers 303, redistribution layers 305, under bump layer 307, and under bumps 309 are formed without performing a planarization process. In some embodiments, the dielectric layers 303, redistribution layers 305, under bump layer 307, and under bumps 309 are formed without first performing a planarization process because the chip package portions 101 are in the aligned and leveled state.

In some embodiments, the chip placement tray 100 is incorporated into the final chip package 300. In other embodiments, the chip placement tray 100 is removed after formation of the dielectric layers 303, redistribution layers 305, under bump layer 307, and under bumps 309 for recycling.

Figure 4:
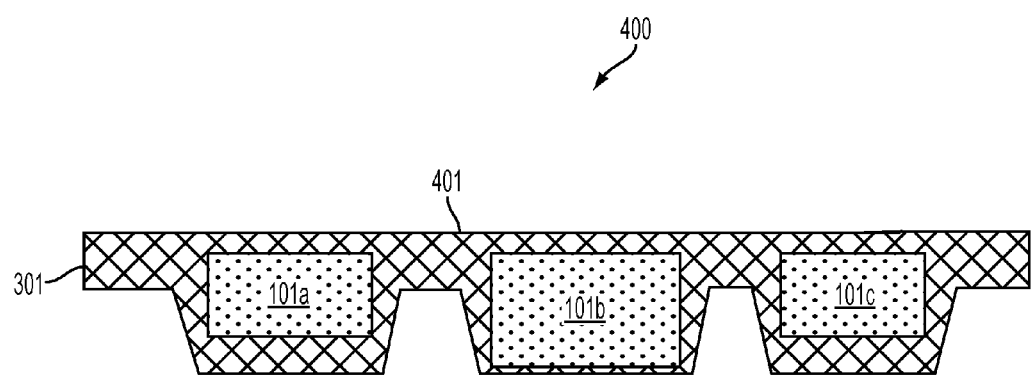
FIG. 4 is a diagram of a portion of a chip package, in accordance with one or more embodiments.

FIG. 4 is cross sectional view of a portion of a chip package 400, according to one or more embodiments. The cross sectional view is taken with respect to cross section A-A' illustrated in either of FIG. 10 or FIG. 11. Chip package 400 includes the molding compound 301 after the molding compound 301 and the chip package portion 101 are removed from the chip placement tray 100.

The molding compound 301 is cured to secure the chip package portions 101 in the aligned and leveled state before removing the cured combination of the molding compound 301 and the chip package portions 101 from the chip placement tray 100.

In some embodiments, the molding compound 301 is subjected to a planarization process that forms a planarized region 401 on at least a portion of the molding compound 301. In some embodiments, the planarized region 401 is formed before the chip placement tray 100 is removed. In other embodiments, the molding compound is subjected to the planarization process that forms the planarized region 401 after the chip placement tray 100 is removed. In some embodiments, the planarized region 401 is formed by way of a grinding process, trimming process, molding process, or any combination thereof, for example.

In either example, removal of the chip placement tray 100 facilitates recycling of the chip placement tray 100 for future use.

Figure 5:
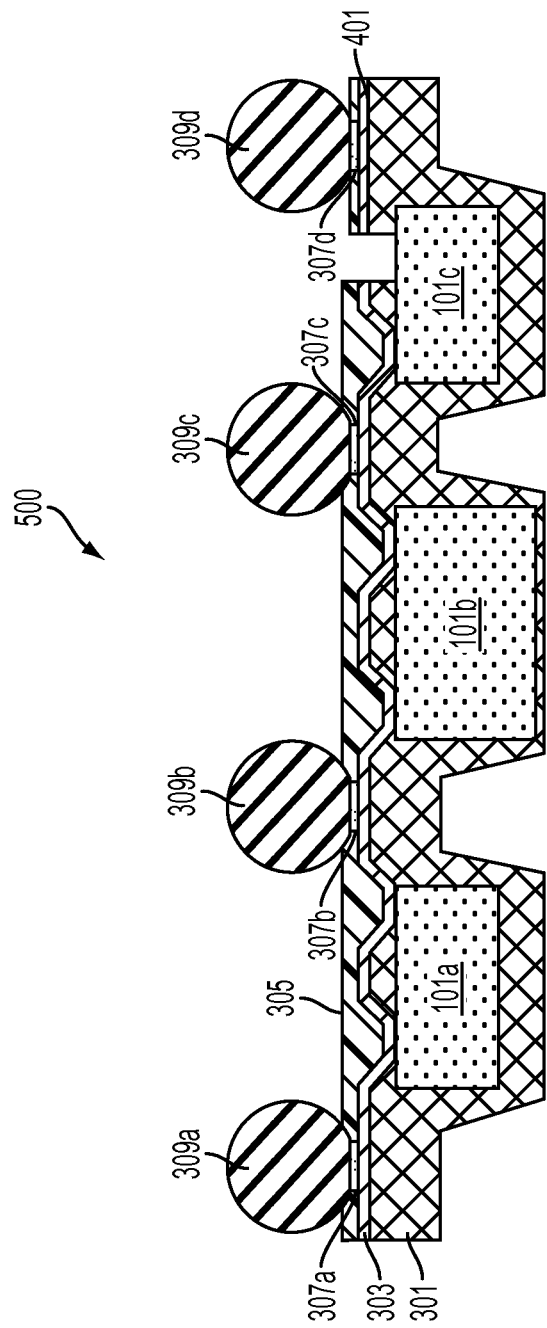
FIG. 5 is a diagram of another chip package, in accordance with one or more embodiments.

FIG. 5 is a cross sectional view of a chip package 500, according to one or more embodiments. The cross sectional view is taken with respect to cross section A-A' in either of FIG. 10 or FIG. 11. Chip package 500 has one or more dielectric layers 303, redistribution layers 305, under bump layer 307, and under bumps 309 formed on one or more of the chip package portions 101 and the planarized region 401 on the molding compound 301. In this example, the final chip package 500 is one that excludes the chip placement tray 100.

Figure 6:
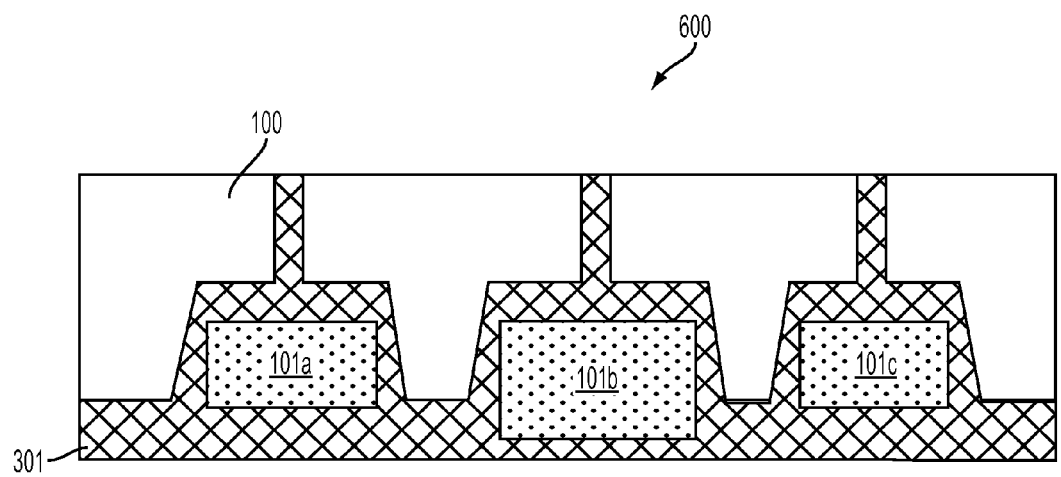
FIG. 6 is a diagram of a portion of another chip package, in accordance with one or more embodiments.

FIG. 6 is a cross sectional view of a portion of a chip package 600, according to one or more embodiments. The cross sectional view is taken with respect to cross section A-A' in either of FIG. 10 or FIG. 11. The portion of the chip package 600 has the chip placement tray 100 in an inverted position.

According to various embodiments, the chip placement tray 100 is configured to be flipped from the upright position with respect to chip package 300 to the inverted position such that the chip placement tray 100, the molding compound 301 having been cured, and the chip package portions 101 are in the inverted position while maintaining the chip package portion 101 in the aligned and leveled state. In embodiments, the cured molding compound 301 and the chip package portions 101 are secured within the reservoirs 121 during the inversion.

Figure 7:
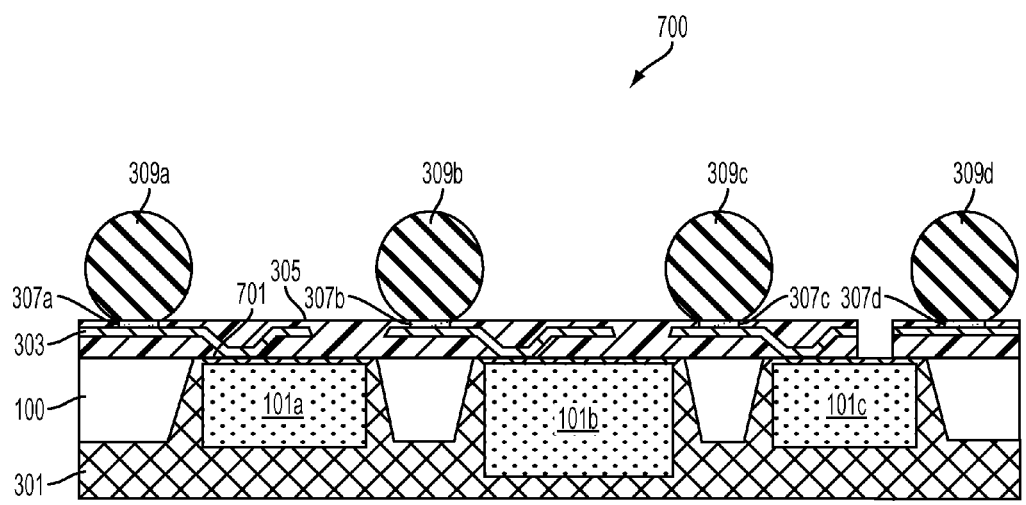
FIG. 7 is a diagram of another chip package, in accordance with one or more embodiments.

FIG. 7 is cross sectional view of a chip package 700, according to one or more embodiments. The cross sectional view is taken with respect to cross section A-A' in either of FIG. 10 or FIG. 11. The chip package 700 includes one or more dielectric layers 303, redistribution layers 305, under bump layer 307, and under bumps 309 formed on one or more of the chip package portions 101, and the molding compound 301 following an inversion with respect to chip package 600.

According to various embodiments, the molding compound 301 and the chip placement tray are subjected to a planarization process to form a planarized region 701 on the molding compound 301 and the chip placement tray 100 prior to forming the any of the dielectric layers 303, redistribution layers 305, under bump layer 307, and under bumps 309. The dielectric layers 303, redistribution layers 305, under bump layer 307, and under bumps 309, accordingly, are formed on the planarized region 701.

In other embodiments, dielectric layers 303, redistribution layers 305, under bump layer 307, and under bumps 309 are formed without performing a planarization process directly onto the lower surface 109. In some embodiments, the dielectric layers 303, redistribution layers 305, under bump layer 307, and under bumps 309 is formed without first performing a planarization process because the chip package portions 101 are in the aligned and leveled state.

In this example, the final chip package 700 includes at least a portion of the chip placement tray 100.

Figure 8:
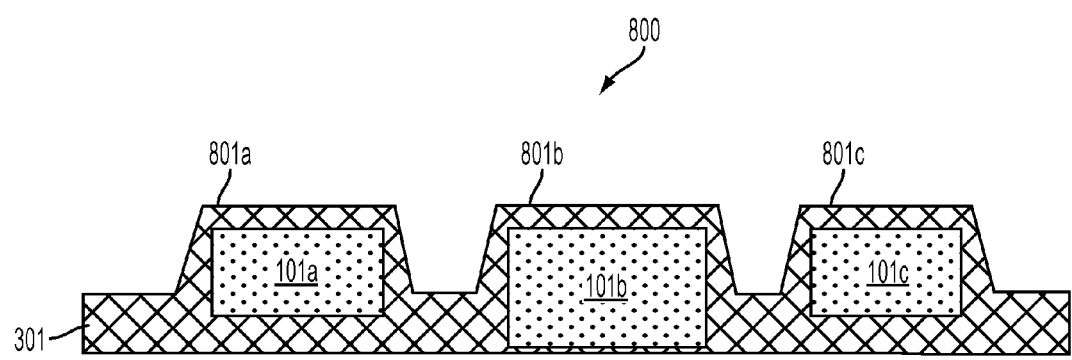
FIG. 8 is a diagram of a portion of another chip package, in accordance with one or more embodiments.

FIG. 8 is a cross sectional view of a portion of a chip package 800, according to one or more embodiments. The cross sectional view is taken with respect to cross section A-A' in either of FIG. 10 or FIG. 11. The portion of a chip package 800 includes the molding compound 301 and the chip package portions 101 following an inversion, and the molding compound 301 and the chip package portions 101 are removed from the chip placement tray 100. The molding compound 301 is cured to secure the chip package portions 101 in the aligned and leveled state before inverting the chip placement tray 100 and removing the cured combination of the molding compound 301 and the chip package portions 101 from the chip placement tray 100.

In some embodiments, the molding compound 301 is subjected to a planarization process that forms planarized regions 801a, 801b and 801c (hereinafter collectively referred to as planarized region 801 where appropriate) on one or more portions of the molding compound 301. The molding compound 301 is subjected to the planarization process that forms the planarized region 801 after the chip placement tray 100 is removed. In some embodiments, the planarized region 801 is formed by way of a grinding process, trimming process, molding process, or any combination thereof, for example. In some embodiments, the planarized region 801 is formed on one or more of the chip package portions 101.

In either example, removal of the chip placement tray 100 facilitates recycling of the chip placement tray 100 for future use.

Figure 9:
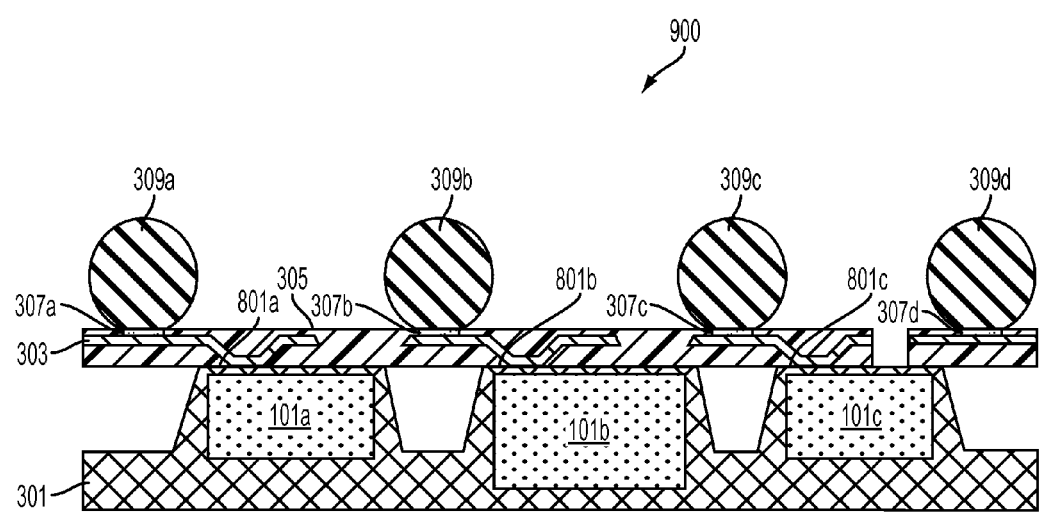
FIG. 9 is a diagram of another chip package, in accordance with one or more embodiments.

FIG. 9 is a cross sectional view of a chip package 900, according to one or more embodiments. The cross sectional view is taken with respect to cross section A-A' in either of FIG. 10 or FIG. 11. The chip package 900 includes one or more dielectric layers 303, redistribution layers 305, under bump layer 307, and under bumps 309 formed on one or more of the portions of the planarized region 801. In this example, the final chip package 900 is one that excludes the chip placement tray 100 and is in an inverted position compared to chip package 500.

Figure 10:
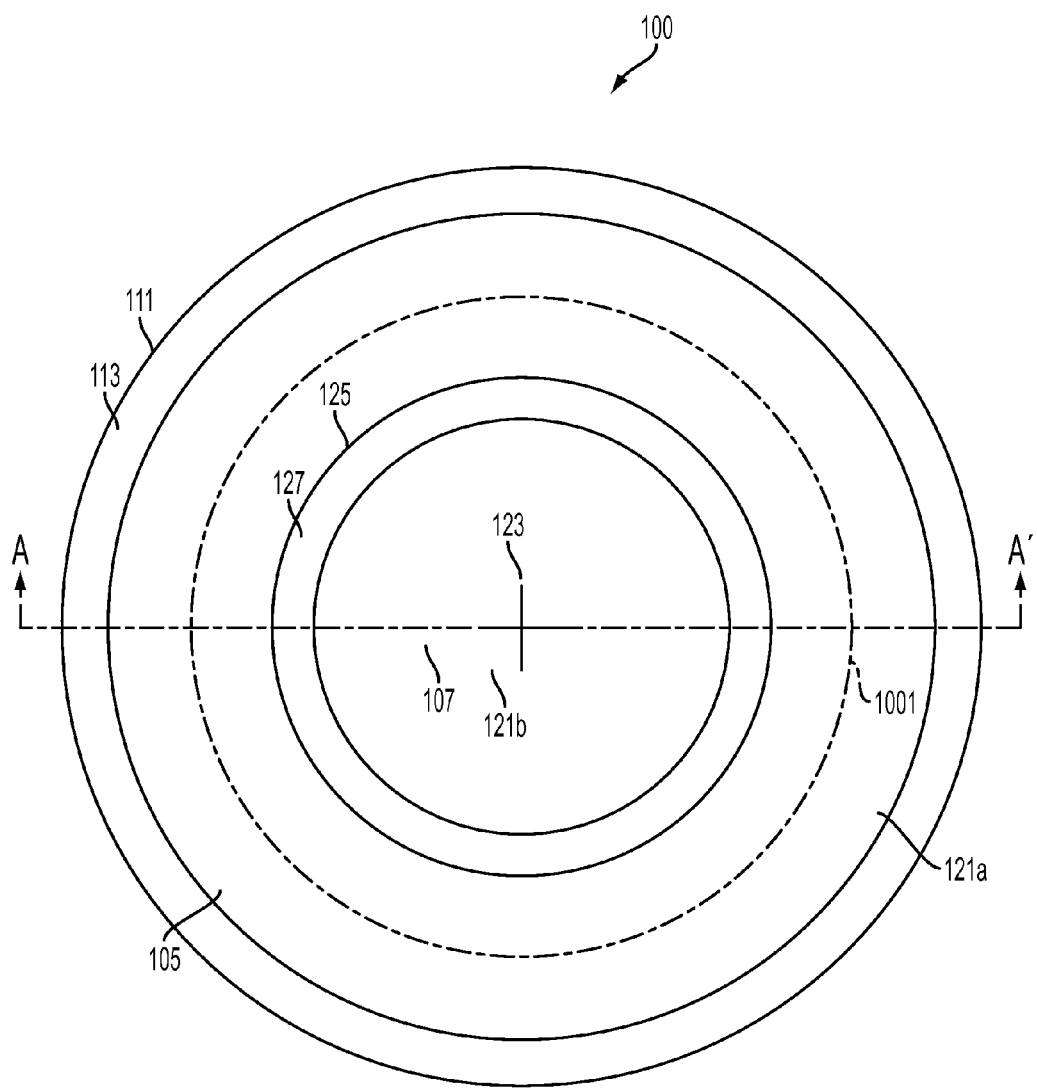
FIG. 10 is a top-side view of a chip placement tray, in accordance with one or more embodiments.

FIG. 10 is a diagram of a top side view of a circular chip placement tray 100, according to one or more embodiments. A cross-section of circular chip placement tray 100 along cross-section A-A' yields any of the side-views discussed with respect to FIGS. 1-9.

In this example, chip placement tray 100 includes a circular base portion 105 having an upper surface 107 and a lower surface opposite the upper surface. The chip placement tray 100 also includes a first circular sidewall portion 111 having a first upper portion distal the upper surface 107 of the base portion. The chip placement tray 100 also has a second circular sidewall portion 125 having a second upper portion 127 distal the upper surface 107 of the base portion 105. The second circular sidewall portion 125 has a radius that is less than a radius of the first circular sidewall portion 111. The first and second sidewall portions 111 and 125 comprise slanted surfaces that either face one another or toward a center 123 of the first and second circular sidewall portions 111 and 125.

The chip placement tray, in this example, includes a first sub-reservoir 121a and a second sub-reservoir 121b. The first sub-reservoir 121a is formed between the slanted surfaces of the first sidewall portion 111 and the second sidewall portion 125. The second sub-reservoir 121b is formed within the slanted surface of the second sidewall portion 125.

The first sub-reservoir 121a and the second sub-reservoir 121b are configured to accommodate at least a first chip package portion 101a and a second chip package portion 101b and cause the first chip package portion 101a to align with respect to a center-line ring 1001 of the first sub-reservoir 121a and cause the second chip package portion 101b to align with respect to the center 123 of the second sub-reservoir 121b.

In some embodiments, though depicted as being circular in this exemplary top-side view, the chip placement tray 100, or any components thereof such as, but not limited to the base portion and any sidewall portions, are any other shape such as, but not limited to, rectangular, square, triangular, trapezoidal, hexagonal, or any other polygon. Similarly, in some embodiments, the chip placement tray 100, or any components thereof such as, but not limited to the base portion and any sidewall portions are oval, partially arced, or comprise any combination of curved and straight edges.

Figure 11:
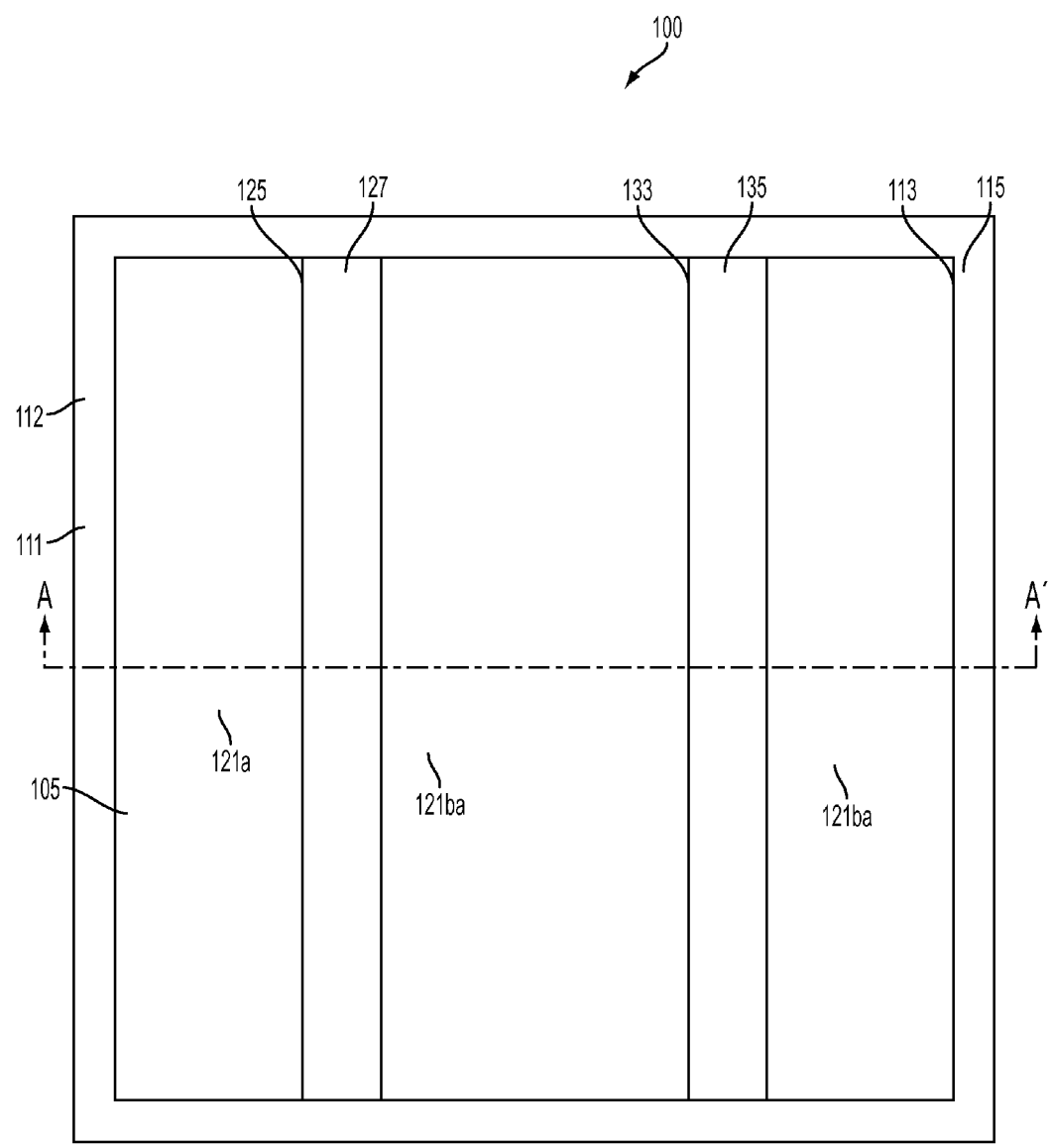
FIG. 11 is a top-side view of another chip placement tray, in accordance with one or more embodiments.

FIG. 11 is a diagram of a top side view of a square chip placement tray 100, according to one or more embodiments. A cross-section of circular chip placement tray 100 along cross-section A-A' yields any of the side-views discussed with respect to FIGS. 1-9.

In this example, chip placement tray 100 includes base portion 105 having an upper surface 107 and a lower surface opposite the upper surface. The chip placement tray 100 also includes a first sidewall portion 111 having a first upper portion 112 distal the upper surface 107 of the base portion. The chip placement tray 100 also has a second sidewall portion 113 having a second upper portion 115 distal the upper surface 107 of the base portion 105. The chip placement tray 100 further includes a third sidewall portion 125 having a third upper portion 127 distal the upper surface 107 of the base portion 105 and a fourth sidewall portion 133 having a fourth upper portion 135 distal the upper surface 107 of the base portion 105. The first, second, third and fourth sidewall portions 111, 113, 125 and 133 comprise slanted surfaces that face one another.

The chip placement tray 100, in this example, includes the first sub-reservoir 121*a*, the third sub-reservoir 121*ba* and the fourth sub-reservoir 121*bb*.

Figure 12:
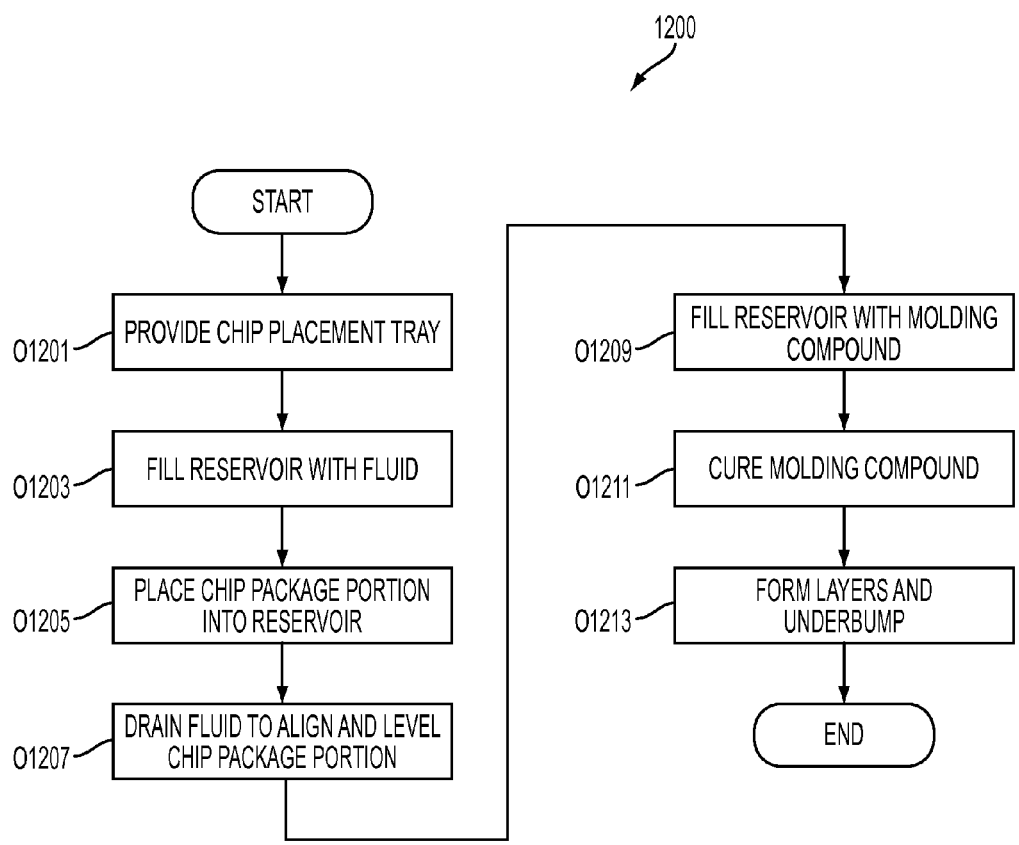
FIG. 12 is a process associated with forming a chip package having self leveled portions of the chip package, in accordance with one or more embodiments.

FIG. 12 is a flowchart of a process 1200 for forming at least a portion of a chip package having one or more self-aligned and leveled chip package portions, according to one or more embodiments.

The process begins with operation O1201 in which an apparatus such as a chip placement tray is provided. Then, in operation O1203, a reservoir is at least partially filled with a fluid. Next, in operation O1205, a chip package portion is placed into the reservoir. The process continues with operation O1207 in which the chip package portion is caused to align with respect to a center of the reservoir by draining at least a portion of the fluid.

Next, in operation O1209, the reservoir is filled, at least partially, with a molding compound. Then, in operation O1211, the molding compound is cured to secure the chip package portion in the aligned and leveled state. In some embodiments, the cured molding compound and the chip package portion are then released from the reservoir. In other embodiments, the cured molding compound and the chip package portion are maintained within the reservoir. In various embodiments, the chip placement tray is flipped before optionally releasing the cured molding compound and the chip package portion from the reservoir. In some embodiments, a planarization process is performed regardless of orientation on one or more of the cured molding compound and the chip placement tray to form a planarized region.

The process continues with operation O1213 in which one or more of a dielectric layer, a redistribution layer, an under bump layer, and an under bump are formed on one or more of the molding compound and the chip package portion. In embodiments, if the planarized region is formed, the dielectric layer, redistribution layer, under bump layer and under bump are formed on the planarized region.

One aspect of this description relates to an apparatus comprising a base portion having an upper surface and a lower surface, the lower surface being opposite the upper surface. The apparatus also comprises a first sidewall portion having a first upper portion distal the upper surface of the base portion. The apparatus further comprises a second sidewall portion having a second upper portion distal the upper surface of the base portion. The apparatus additionally comprises a first slanted surface facing in a direction toward the second sidewall portion and extending from the first upper portion of the first sidewall portion toward the upper surface of the base portion at a first angle.

The apparatus also comprises a second slanted surface facing in a direction toward the first side wall portion and extending from the second upper portion of the second sidewall portion toward the upper surface of the base portion at a second angle, the first slanted surface and the second slanted surface being configured to form a reservoir therebetween to accommodate a first chip package portion and cause the first chip package portion to align with respect to a center of the reservoir based on a relationship between the first chip package portion, the first angle, the second angle, and a fluid accommodated by the reservoir. The apparatus further comprises a first drain region between the first slanted surface and the second slanted surface configured to enable the fluid to egress from the reservoir.

Another aspect of this description relates to a method that involves filling, at least partially, a reservoir formed between a first sidewall portion having a first slanted surface and a second sidewall portion having a second slanted surface with a fluid, the first slanted surface facing the second slanted surface. The method also involves placing a chip package portion into the reservoir. The method further involves causing the chip package portion to align with respect to a center of the reservoir based on a relationship between the chip package portion, an angle of the first slanted surface, an angle of the second slanted surface, and the fluid.

Still another aspect of this description relates to an apparatus that comprises a base portion having an upper surface and a lower surface, the lower surface being opposite the upper surface. The apparatus also comprises a first circular sidewall portion having a first upper portion distal the upper surface of the base portion. The apparatus further comprises a first slanted surface facing in a direction toward a center of the circular sidewall portion and extending from the first upper portion of the first sidewall portion toward the upper surface of the base portion at a first angle, the first slanted surface being configured to form a reservoir within a center region of the circular sidewall portion to accommodate a first chip package portion and cause the first chip package portion to align with respect to a center of the reservoir based on a relationship between the first chip package portion, the first angle, and a fluid accommodated by the reservoir. The apparatus additionally comprises a first drain region configured to enable the fluid to egress from the reservoir.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:
1. An apparatus comprising:
a base portion having an upper surface and a lower surface, the lower surface being opposite the upper surface;
a first sidewall portion having a first upper portion distal the upper surface of the base portion;

a second sidewall portion having a second upper portion distal the upper surface of the base portion;

a first slanted surface facing in a direction toward the second sidewall portion and extending from the first upper portion of the first sidewall portion toward the upper surface of the base portion at a first angle;

a second slanted surface facing in a direction toward the first sidewall portion and extending from the second upper portion of the second sidewall portion toward the upper surface of the base portion at a second angle, the first slanted surface and the second slanted surface being configured to form a reservoir therebetween to accommodate a first chip package portion and cause the first chip package portion to align with respect to a center of the reservoir based on a relationship between the first chip package portion, the first angle, the second angle, and a fluid accommodated by the reservoir; and a first drain region between the first slanted surface and the second slanted surface configured to enable the fluid to egress from the reservoir.

2. The apparatus of claim 1, further comprising:

a third sidewall portion having a third upper portion distal the upper surface of the base portion, the third sidewall portion being positioned between the first sidewall portion and the second sidewall portion;

a third slanted surface facing in a direction toward the first sidewall portion and extending from the third upper portion of the third sidewall portion toward the upper surface of the base portion at a third angle; and a fourth slanted surface facing in a direction toward the second sidewall portion and extending from the third upper portion of the third sidewall portion toward the upper surface of the base portion at a fourth angle, wherein the third sidewall portion divides the reservoir into a first sub-reservoir and a second sub-reservoir, the first sub-reservoir being formed by the first slanted surface and the third slanted surface and the second sub-reservoir being formed by the second slanted surface and the fourth slanted surface, the first sub-reservoir is formed to accommodate the first chip package portion and the second sub-reservoir is formed to accommodate a second chip package portion, the first slanted surface and the third slanted surface are configured to cause the first chip package portion to align with respect to a center of the first sub-reservoir based on a relationship between the first chip package portion, the first angle, the third angle, and a fluid accommodated by the first sub-reservoir, and the second slanted surface and the fourth slanted surface are configured to cause the second chip package portion to align with respect to a center of the second sub-reservoir based on a relationship between the second chip package portion, the second angle, the fourth angle and a fluid accommodated by the second sub-reservoir.

3. The apparatus of claim 2, further comprising:

a fourth sidewall portion having a fourth upper portion distal the upper surface of the base portion, the fourth sidewall portion being positioned between the third sidewall portion and the second sidewall portion;

fifth slanted surface facing in a direction toward the first sidewall portion and extending from the fourth upper portion of the fourth sidewall portion toward the upper surface of the base portion at a fifth angle; and a sixth slanted surface facing in a direction toward the second sidewall portion and extending from the fourth upper portion of the fourth sidewall portion toward the upper surface of the base portion at a sixth angle, wherein the fourth sidewall portion divides the second sub reservoir to form a third sub-reservoir such that the second sub-reservoir is formed by the fourth slanted surface and the fifth slanted surface and the third sub-reservoir is formed by the sixth slanted surface and the second slanted surface, the first sub-reservoir, the second sub-reservoir and the third sub-reservoir are formed to accommodate the first chip package portion, the second chip package portion and a third chip package portion and, the first slanted surface and the third slanted surface are configured to cause the first chip package portion to align with respect to a center of the first sub-reservoir based on a relationship between the first chip package portion, the first angle, the third angle, and a fluid accommodated by the first sub-reservoir, the fourth slanted surface and the fifth slanted surface are configured to cause the second chip package portion to align with respect to a center of the second sub-reservoir based on a relationship between the second chip package portion, the fourth angle, the fifth angle and a fluid accommodated by the second sub-reservoir, and the second slanted surface and the sixth slanted surface are configured to cause the third chip package portion to align with respect to a center of the third sub-reservoir based on a relationship between the third chip package portion, the second angle, the sixth angle and a fluid accommodated by the third sub-reservoir.

4. The apparatus of claim 3, wherein the fluid accommodated by the first sub-reservoir, the second sub-reservoir and the third sub-reservoir is the same fluid.

5. The apparatus of claim 3, wherein the fluid accommodated by the first sub-reservoir, the second sub-reservoir and the third sub-reservoir egresses through the first drain region.

6. The apparatus of claim 3, wherein the first drain region corresponds to the first sub-reservoir and is configured to allow the fluid accommodated by at least the first sub-reservoir to egress, and the apparatus further comprises a second drain region that corresponds to the second sub-reservoir configured to allow the fluid accommodated by at least the second sub-reservoir to egress.

7. The apparatus of claim 6, further comprising a third drain region that corresponds to the third sub-reservoir configured to allow the fluid accommodated by at least the third sub-reservoir to egress.

8. The apparatus of claim 3, wherein one or more of the first slanted surface, the second slanted surface, the fourth slanted surface, the fifth slanted surface and the sixth slanted surface are configured to cause one or more the first sub-reservoir, the second sub-reservoir and the third sub-reservoir to have a depth different than one or more of the other sub-reservoirs.

9. The apparatus of claim 1, wherein the reservoir is further configured to accommodate a molding compound to secure the first chip package portion in an aligned and leveled state following egress of the fluid accommodated by the reservoir.

10. The apparatus of claim 9, wherein one or more of a dielectric layer, a redistribution layer, an under bump layer, and an under bump are formed on one or more of the first chip package portion and the molding compound, the first chip package portion being secured in the aligned and leveled state by the molding compound.

11. The apparatus of claim 9, wherein one or more of a dielectric layer, a redistribution layer, an under bump layer, and an under bump are formed on one or more of the first chip package portion and the molding compound, the first chip package portion being secured in the aligned and leveled state by the molding compound following a curing of the molding compound.

12. The apparatus of claim 1, wherein the reservoir is further configured to accommodate a molding compound to secure the first chip package portion in an aligned and leveled state and enable the molding compound to cover the entire first chip package portion, the molding compound having a planarized region on a surface of the molding compound.

13. The apparatus of claim 12, wherein one or more of a dielectric layer, a redistribution layer, an under bump layer, and an under bump are on one or more of the first chip package portion and the planarized region on the molding compound.

14. The apparatus of claim 1, wherein the reservoir is further configured to accommodate a molding compound to secure the first chip package portion in an aligned and leveled state, the apparatus is configured to be flipped from a first orientation to a second orientation while maintaining the first chip package portion in the aligned and leveled state, and the apparatus is configured to be subjected to a planarization process to form a planarized region on at least a portion of the apparatus.

15. The apparatus of claim 14, wherein one or more of a dielectric layer, a redistribution layer, an under bump layer, and an under bump are on one or more of the first chip package portion and the planarized region on the apparatus.

16. The apparatus of claim 1, wherein the reservoir is further configured to accommodate a molding compound to secure the first chip package portion in an aligned and leveled state, be flipped from a first orientation to a second orientation while maintaining the first chip package portion in the aligned and leveled state, and release the first chip package portion and the molding compound to enable the molding compound to be subjected to a planarization process to form a planarized region.

17. The apparatus of claim 16, wherein one or more of a dielectric layer, a redistribution layer, an under bump layer, and an under bump are on at least the planarized region.

18. An apparatus comprising:
a base portion having an upper surface and a lower surface, the lower surface being opposite the upper surface;
a first circular sidewall portion having a first upper portion distal the upper surface of the base portion;
a first circular slanted surface facing in a direction toward a center of the first circular sidewall portion and extending from the first upper portion of the first circular sidewall portion toward the upper surface of the base portion at a first angle, the first circular slanted surface being configured to form a reservoir within a center region of the circular sidewall portion to accommodate a first chip package portion and cause the first chip package portion to align with respect to a center of the reservoir based on a relationship between the first chip package portion, the first angle, and a fluid accommodated by the reservoir; and
a first drain region configured to enable the fluid to egress from the reservoir.

19. The apparatus of claim 18, further comprising:
a second circular sidewall portion having a second upper portion distal the upper surface of the base portion, the second circular sidewall portion having a radius less than a radius of the first circular sidewall portion;
a second circular slanted surface facing in a direction toward the first circular sidewall portion and extending from the second upper portion of the second circular sidewall portion toward the upper surface of the base portion at a second angle;
a third circular slanted surface facing in a direction toward a center of the second circular sidewall portion and extending from the second upper portion of the second circular sidewall portion toward the upper surface of the base portion at a third angle, wherein the second circular sidewall portion divides the reservoir into a first sub-reservoir and a second sub-reservoir, the first sub-reservoir being formed by the first circular slanted surface and the second circular slanted surface and the second sub-reservoir being formed within the third circular slanted surface, wherein the first sub-reservoir is formed to accommodate the first chip package portion and the second sub-reservoir is formed to accommodate a second chip package portion, the first circular slanted surface and the second circular slanted surface being configured to cause the first chip package portion to align with respect to a center-line ring of the first sub-reservoir based on a relationship between the first chip package portion, the first angle, the second angle, and a fluid accommodated by the first sub-reservoir, and the third slanted surface is configured to cause the second chip package portion to align with respect to a center of the second sub-reservoir based on a relationship between the second chip package portion, the third angle, and a fluid accommodated by the second sub-reservoir.

20. The apparatus of claim 18, wherein the reservoir is further configured to accommodate a molding compound to secure the first chip package portion in an aligned and leveled state following egress of the fluid accommodated by the reservoir, and one or more of a dielectric layer, a redistribution layer, an under bump layer, and an under bump are formed on one or more of the first chip package portion and the molding compound, the first chip package portion being secured in the aligned and leveled state by the molding compound.

21. An apparatus comprising:
a base portion having an upper surface and a lower surface, the lower surface being opposite the upper surface;
a first sidewall portion having a first upper portion distal the upper surface of the base portion;
a first slanted surface, the first slanted surface being contiguous with and extending from the first upper surface of the base portion and facing in a direction toward a center of the apparatus and extending from the first upper portion of the first sidewall portion toward the upper surface of the base portion at a first angle, the first slanted surface at least partially defining a reservoir to accommodate a first chip package portion; and
a drain region configured to enable fluid to egress from the reservoir.

22. The apparatus of claim 21, further comprising:
a second sidewall portion having a second upper portion distal the upper surface of the base portion;
a second slanted surface facing in a direction toward the first sidewall portion and extending from the second upper portion of the second sidewall portion toward the upper surface of the base portion at a second angle, wherein the reservoir is defined between the first slanted surface and the second slanted surface.

23. The apparatus of claim 22, wherein the first angle is substantially equal to the second angle.

24. The apparatus of claim 22, wherein the first angle is different from the second angle.

25. The apparatus of claim 21, wherein the first slanted surface at least partially defines the reservoir to cause the first chip package portion to align with respect to a center of the reservoir based on a relationship between the first chip package portion, the first angle, and a fluid accommodated by the reservoir.

* * * * *